US006830862B2

(12) United States Patent
Kitson et al.

(10) Patent No.: US 6,830,862 B2
(45) Date of Patent: Dec. 14, 2004

(54) MULTI-LAYER IMAGEABLE ELEMENT WITH A CROSSLINKED TOP LAYER

(75) Inventors: Paul Kitson, Evans, CO (US); Jayanti Patel, Woodcliff Lake, NJ (US); Jianbing Huang, Trumball, CT (US); Paul West, Fort Collins, CO (US); Ken-ichi Shimazu, Briarcliff Manor, NY (US)

(73) Assignee: Kodak Polychrome Graphics, LLC, Norwalk, CT (US)

( * ) Notice: Subject to any disclaimer, the term of this patent is extended or adjusted under 35 U.S.C. 154(b) by 204 days.

(21) Appl. No.: 10/087,891

(22) Filed: Feb. 28, 2002

(65) Prior Publication Data

US 2003/0162126 A1 Aug. 28, 2003

(51) Int. Cl.[7] ............................ G03F 7/023; G03F 7/30

(52) U.S. Cl. .................... 430/156; 430/166; 430/270.1; 430/271.1; 430/273.1; 430/302

(58) Field of Search ................................ 430/156, 166, 430/270.1, 271.1, 273.1, 302

(56) References Cited

U.S. PATENT DOCUMENTS

| | | | | | |
|---|---|---|---|---|---|
| 5,919,600 | A | | 7/1999 | Huang et al. | |
| 6,040,113 | A | * | 3/2000 | Van Damme et al. | 430/271.1 |
| 6,083,663 | A | * | 7/2000 | Vermeersch et al. | 430/302 |
| 6,140,005 | A | * | 10/2000 | Van Damme et al. | 430/156 |
| 6,152,036 | A | * | 11/2000 | Verschueren et al. | 101/457 |
| 6,165,689 | A | * | 12/2000 | Vermeersch et al. | 430/302 |
| 6,210,857 | B1 | | 4/2001 | Vermeersch et al. | |
| 6,294,311 | B1 | | 9/2001 | Shimazu et al. | 430/271.1 |
| 6,352,811 | B1 | | 3/2002 | Patel et al. | 430/270.1 |
| 6,352,812 | B1 | | 3/2002 | Shimazu et al. | 430/273.1 |
| 6,472,119 | B1 | * | 10/2002 | Verschueren et al. | 430/270.1 |

FOREIGN PATENT DOCUMENTS

| | | | |
|---|---|---|---|
| EP | 0 864 420 | A1 | 9/1998 |
| EP | 0 908 305 | A1 | 4/1999 |
| EP | 0 908 307 | A2 | 4/1999 |
| EP | 0 908 779 | A1 | 4/1999 |
| EP | 0 908 784 | A1 | 4/1999 |
| EP | 0 940 266 | A1 | 9/1999 |
| EP | 0 950 518 | A1 | 10/1999 |
| EP | 0 960 728 | A1 | 12/1999 |
| EP | 1 023 994 | A1 | 8/2000 |

OTHER PUBLICATIONS

NeoPac E–125, Bulletin E–125, NeoResins, Wilmington, MA, Aug. 2000.

NeoCryl XK–98, Bulletin XK–98, NeoResins, Wilmington, MA, Apr. 2001.

"New One–Pack Crosslinking Polymers," P. Bell, NeoResins, Wilmington, MA, posted to web site Oct. 1, 2001.

* cited by examiner

*Primary Examiner*—John S. Chu
(74) *Attorney, Agent, or Firm*—RatnerPrestia

(57) ABSTRACT

A positive working, multi-layer thermally imageable element is disclosed. The element comprises a substrate, an underlayer, and a top layer. The top layer comprises a crosslinked polymeric material. The element may be thermally imaged and developed to form a lithographic printing plate.

37 Claims, No Drawings

MULTI-LAYER IMAGEABLE ELEMENT WITH A CROSSLINKED TOP LAYER

FIELD OF THE INVENTION

This invention relates to lithographic printing. In particular, this invention relates to positive working, multi-layer thermally imageable elements in which the top layer comprises a crosslinked polymer.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plates, also called printing plate precursors, typically comprise a top layer applied over the surface of a hydrophilic substrate. The top layer includes one or more radiation-sensitive components, which may be dispersed in a suitable binder. Alternatively, the radiation-sensitive component can also be the binder material.

If after exposure to radiation, the exposed regions are removed in the developing process, revealing the underlying hydrophilic surface of the support, the plate is called as a positive-working printing plate. Conversely, if the unexposed regions are removed by the developing process and the exposed regions remain, the plate is called a negative-working plate. In each instance, the regions of the radiation-sensitive layer (i.e., the image areas) that remain are ink-receptive and the regions of the hydrophilic surface revealed by the developing process accept water, typically a fountain solution, and repel ink.

Direct digital imaging of offset printing plates, which obviates the need for exposure through a negative, is becoming increasingly important in the printing industry. Positive working, multi-layer, thermally imageable elements that comprise a hydrophilic substrate, an alkali developer soluble underlayer, and a thermally imageable top layer have been disclosed. On infrared exposure, the exposed regions of the top layer become soluble in or permeable by the alkaline developer. The developer penetrates the top layer and removes the underlayer and the top layer, revealing the underlying substrate. Such systems are disclosed in, for example, Parsons, WO 97/39894 and U.S. Pat. No. 6,280,899; Shimazu, U.S. Pat. No. 6,294,311; Nagasaka, EP 0 823 327; Miyake, EP 0 909 627; West, WO 98/42507; and Nguyen, WO 99/1145.

Despite the advantages that have been made in the development of multi-layer thermally imageable elements, elements in which the top layer has increased resistance to developer and to damage during handing would be desirable. Thus, a need exists for positive working, multi-layer, thermally imageable elements that have increased resistance to developer and to damage during handing, but whose imaging speed is unaffected.

SUMMARY OF THE INVENTION

In one aspect, the invention is a positive working, multi-layer, thermally imageable element, the imageable element comprising, in order:

a substrate having a hydrophilic surface, an underlayer comprising a first polymeric material over the hydrophilic surface, and a top layer comprising a second polymeric material over the underlayer, in which:

the second polymeric material is crosslinked;

the top layer is ink receptive and insoluble in an alkaline developer;

the top layer and the underlayer are each removable by the alkaline developer following thermal exposure of the element; and the element comprises a photothermal conversion material.

In another aspect, the invention is a method for forming the element. In another aspect, the invention is a method for forming an image by exposing and developing the element. In yet another aspect, the invention is an image, useful as a lithographic printing plate, formed by exposing and developing the element.

DETAILED DESCRIPTION OF THE INVENTION

Unless the context indicates otherwise, in the specification and claims, the terms "first polymeric material," "second polymeric material," "photothermal conversion material," "coating solvent," and similar terms also refer to mixtures of such materials. Unless indicated otherwise, percentages refer to percents by weight.

Imageable Elements

In one aspect, the invention is a thermally imageable element. The element comprises a substrate, an underlayer, and a crosslinked top layer. Optionally, a barrier layer or an absorber layer may be between the underlayer and the top layer. The element also comprises a photothermal conversion material, which may be in the top layer, the underlayer and/or the absorber layer.

Substrate

The substrate has at least one hydrophilic surface. It comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequent coated layers. Examples of subbing layer materials are adhesion-promoting materials, such as alkoxysilanes, amino-propyltriethoxysilane, glycidoxypropyltriethoxysilane and epoxy functional polymers, as well as conventional subbing materials used on polyester bases in photographic films.

The surface of an aluminum support may be treated by techniques known in the art, including physical graining, electrochemical graining, chemical graining, and anodizing. The substrate should be of sufficient thickness to sustain the wear from printing and be thin enough to wrap around a printing form, typically from about 100 to about 600 μm. Typically, the substrate comprises an interayer between the aluminum support and the top layer. The interlayer may be formed by treatment of the support with, for example, silicate, dextrine, hexafluorosilicic acid, phosphate/fluoride, polyvinyl phosphonic acid (PVPA) or polyvinyl phosphonic acid copolymers.

The back side of the substrate (i.e., the side opposite the underlayer and top layer) may be coated with an antistatic agent and/or a slipping layer or matte layer to improve handling and "feel" of the imageable element.

Underlayer

The underlayer is between the hydrophilic surface of the substrate and the top layer. After imaging, it is removed by the developer to expose the underlying hydrophilic surface of the substrate. It is preferably soluble in the alkaline developer to prevent sludging of the developer.

The underlayer comprises a first polymeric material. The first polymeric material is preferably soluble in an alkaline developer. In addition, the first polymeric material is preferably insoluble in the solvent used to coat the top layer so that the top layer can be coated over the underlayer without dissolving the underlayer.

Polymeric materials useful as the first polymeric material include those that contain an acid and/or phenolic functionality, and mixtures of such materials. Useful polymeric materials include carboxy functional acrylics, vinyl acetate/-crotonate/vinyl neodecanoate copolymers, styrene maleic anhydride copolymers, phenolic resins, maleated wood rosin, and combinations thereof. Underlayers that provide resistance both to fountain solution and aggressive washes are disclosed in Shimazu, U.S. Pat. No. 6,294,311, incorporated herein by reference.

Particularly useful polymeric materials are copolymers that comprise N-substituted maleimides, especially N-phenylmaleimide; polyvinylacetals; metha-crylamides, especially methacylamide; and acrylic and/or methacrylic acid, especially methacrylic acid. More preferably, two functional groups are present in the polymeric material, and most preferably, all three functional groups are present in the polymeric material. The preferred polymeric materials of this type are copolymers of N-phenylmaleimide, methacrylamide, and methacrylic acid, more preferably those that contain about 25 to about 75 mol %, preferably about 35 to about 60 mol % of N-phenylmaleimide; about 10 to about 50 mol %, preferably about 15 to about 40 mol % of methacrylamide; and about 5 to about 30 mol %, preferably about 10 to about 30 mol %, of methacrylic acid. Other hydrophilic monomers, such as hydroxyethyl methacrylate, may be used in place of some or all of the methacrylamide. Other alkaline soluble monomers, such as acrylic acid, may be used in place of some or all of the methacrylic acid.

These polymeric materials are soluble in alkaline developers. In addition, they are soluble in a methyl lactate/methanol/dioxolane (15:42.5:42.5 wt %) mixture, which can be used as the coating solvent for the underlayer. However, they are poorly soluble in solvents such as acetone, which can be used as solvents to coat the top layer on top of the underlayer without dissolving the underlayer. These polymeric materials are typically resistant to washes with 80 wt % diacetone alcohol/20 wt % water.

Another group of preferred polymeric materials for the first polymeric material are alkaline developer soluble copolymers that comprise a monomer that has a urea bond in its side chain (i.e., a pendent urea group), such are disclosed in Ishizuka, U.S. Pat. No. 5,731,127. These copolymers comprise about 10 to 80 wt %, preferably about 20 to 80 wt %, of one of more monomers represented by the general formula:

$$[CH_2{=}C(R){-}CO_2{-}X{-}NH{-}CO{-}NH{-}Y{-}Z],$$

in which R is —H or —$CH_3$; X is a bivalent linking group; Y is a substituted or unsubstituted bivalent aromatic group; and Z is —OH, —COOH, or —$SO_2NH_2$.

R is preferably —$CH_3$. Preferably X is a substituted or unsubstituted alkylene group, substituted or unsubstituted phenylene [$C_6H_4$] group, or substituted or unsubstituted naphthalene [$C_{10}H_6$] group; such as —$(CH_2)_n$—, in which n is 2 to 8; 1,2-, 1,3-, and 1,4-phenylene; and 1,4-, 2,7-, and 1,8-naphthalene. More preferably X is unsubstituted and even more preferably n is 2 or 3; most preferably X is —$(CH_2CH_2)$—. Preferably Y is a substituted or unsubstituted phenylene group or substituted or unsubstituted naphthalene group; such as 1,2-, 1,3-, and 1,4-phenylene; and 1,4-, 2,7-, and 1,8-naphthalene. More preferably Y is unsubstituted, most preferably unsubstituted 1,4-phenylene. Z is —OH, —COOH, or —$SO_2NH_2$, preferably —OH. A preferred monomer is:

$$[CH_2{=}C(CH_3){-}CO_2{-}CH_2CH_2{-}NH{-}CO{-}NH\text{-}p\text{-}C_6H_4{-}Z],$$

in which Z is —OH, —COOH, or —$SO_2NH_2$, preferably —OH.

In the synthesis of a copolymer, one or more of the urea group containing monomers may be used. The copolymers also comprise 20 to 90 wt % other polymerizable monomers, such as maleimide, acrylic acid, methacrylic acid, acrylic esters, methacrylic esters, acrylonitrile, methacrylonitrile, acrylamides, and methacrylamides. A copolymer that comprises in excess of 60 mol % and not more than 90 mol % of acrylonitrile and/or methacrylonitrile in addition to acrylamide and/or methacrylamide provides superior physical properties. More preferably the alkaline soluble copolymers comprise 30 to 70 wt % urea group containing monomer; 20 to 60 wt % acrylonitrile or methacrylonitrile, preferably acrylonitrile; and 5 to 25 wt % acrylamide or methacrylamide, preferably methacrylamide. These polymeric materials are typically resistant to washes with 80 wt % 2-butoxyethanol/20 wt % water.

The polymeric materials described above are soluble in alkaline developers. In addition, they are soluble in polar solvents, such as ethylene glycol monomethyl ether, which can be used as the coating solvent for the underlayer. However, they are poorly soluble in less polar solvents, such as 2-butanone (methyl ethyl ketone), which can be used as a solvent to coat the top layer over the underlayer without dissolving the underlayer.

Both these groups of polymeric materials can be prepared by methods, such as free radical polymerization, well known to those skilled in the art. Synthesis of copolymers that have urea bonds in their side chains is disclosed, for example, in Ishizuka, U.S. Pat. No. 5,731,127.

Other alkaline developer soluble polymeric materials may be useful in the underlayer. Derivatives of methyl vinyl ether/maleic anhydride copolymers that contain an N-substituted cyclic imide moiety and derivatives of styrene/maleic anhydride copolymers that contain an N-substituted cyclic imide moiety may be useful if they have the required solubility characteristics. These copolymers can be prepared by reaction of the maleic anhydride copolymer with an amine, such as p-aminobenzenesulfonamide, or p-aminophenol, followed by ring closure by acid.

Another group of polymeric materials that are useful in the underlayer include alkaline developer soluble copolymers that comprise about 10 to 90 mol % of a sulfonamide monomer unit, especially those that comprise N-(p-aminosulfonylphenyl)methacrylamide, N-(m-aminosulfonylphenyl)-methacrylamide N-(o-aminosulfonylphenyl)methacrylamide, and/or the corresponding acrylamide. Useful alkaline developer soluble polymeric materials that comprise a pendent sulfonamide group, their method of preparation, and monomers useful for their preparation, are disclosed in Aoshima, U.S. Pat. No. 5,141,838. Particularly useful polymeric materials comprise (1) the sulfonamide monomer unit, especially N-(p-aminosulfonylphenyl)methacrylamide; (2) acrylonitrile and/or methacrylonitrile; and (3) methyl methacrylate and/or methyl acrylate. These polymeric materials are typically resistant to washes with 80 wt % 2-butoxyethanol/20 wt % water.

Combinations of alkaline developer soluble polymeric materials may be used in the underlayer to provide improved chemical resistance, i.e., resistance to both fountain solution and to aggressive washes. A combination of a polymeric material that is resistant to 80 wt % diacetone alcohol/20 wt % water, which tests resistance to a UV wash, with a polymeric material that is resistant to 80 wt % 2-butoxyethanol/20 wt % water, which tests resistance to alcohol sub fountain solution, surprisingly produces a layer that shows good resistance to both solvent mixtures. Preferably, one polymeric material has a one-minute soak loss of less than about 20%, more preferably less than about 10%, and most preferably less than about 5% in 80 wt % diacetone alcohol/20 wt % water, and the other polymeric material has a one-minute soak loss of less than about 20%, more preferably less than about 10%, and most preferably less than about 10%, in 80 wt % 2-butoxyethanol/20 wt % water. One-minute soak loss is measured by coating a layer of the polymeric material on a substrate, typically at a coating weight of about 1.5 g/m$^2$, soaking the coated substrate in the appropriate solvent for one minute at room temperature, drying the coated substrate, and measuring the weight loss as a percent of the total weight of polymeric material present on the substrate.

The ability of an underlayer to withstand both fountain solution and aggressive washes can be estimated by a chemical resistance parameter (CRP), defined as follows:

$$CRP=[(100-a)(100-b)]/10^4$$

in which:

a is the one minute % soak loss in 80 wt % diacetone alcohol/20 wt % water; and b is the one minute % soak loss in 80 wt % 2-butoxyethanol/20 wt % water.

The chemical resistance parameter should be greater than about 0.4, preferably greater than about 0.5, more preferably greater than about 0.6. In favorable cases, a chemical resistance parameter of at least about 0.65 can be obtained. The one-minute soak loss in each solvent should be less than about 60%, preferably less than about 40%, and more preferably less than about 35%. Preferably, the one-minute soak loss should be less than about 60%, preferably less than about 40%, and more preferably less than about 35%, in one solvent and less than about 40%, more preferably less than about 30%; and more preferably less than about 20%, and most preferably less than about 10% in the other solvent.

Combination of (1) a copolymer that comprises N-substituted maleimides, especially N-phenylmaleimide; methacrylamides, especially methacylamide; and acrylic and/or methacrylic acid, especially methacrylic acid with (2) an alkaline soluble copolymer that comprises a urea in its side chain or with an alkaline soluble copolymer that comprises 10 to 90 mol % of a sulfonamide monomer unit, especially one that comprise N-(p-aminosulfonylphenyl) methacrylamide, N-(m-aminosulfonylphenyl) methacrylamide N-(o-aminosulfonylphenyl) methacrylamide, and/or the corresponding acrylamide, is especially advantageous. One or more other polymeric materials, such as novolac resins, may also be present in the combination. Preferred other polymeric materials, when present, are novolac resins.

When a combination of polymeric materials is used, the underlayer typically comprises about 10% to about 90% by weight of the polymeric material that is resistant to 80 wt % diacetone alcohol/20 wt % water, and about 10% to about 90% by weight of the polymeric material that is resistant to 80 wt % 2-butoxyethanol/20 wt % water, based on the total weight these polymeric materials in the underlayer. Preferably the underlayer comprises about 40% to about 85% by weight of the polymeric material that is resistant to 80 wt % diacetone alcohol/20 wt % water and about 15% to about 60% of the polymeric material that is resistant to 80 wt % 2-butoxyethanol/20 wt % water, based on the total weight these two polymeric materials in the underlayer. These materials together typically comprise at least about 50 wt %, preferably at least about 60 wt %, and more preferably at least about 65 wt %, of the underlayer, based on total weight of the materials in the underlayer. When present, up to about 20 wt %, preferably about 1 to about 20 wt %, other polymeric materials may be present in the underlayer, based on the total amount of all the polymeric materials in the underlayer.

Photothermal Conversion Material

The element comprises a photothermal conversion material. The photothermal conversion material may be present in the top layer, the underlayer, and/or an absorber layer. To minimize ablation of the top layer during thermal imaging, the photothermal conversion material is preferably in the underlayer and/or a separate absorber layer, and the top layer is substantially free of photothermal conversion material.

Photothermal conversion materials absorb radiation and convert it to heat. Photothermal conversion materials may absorb ultraviolet, visible, and/or infrared radiation and convert it to heat. Although the first polymeric material may comprise an absorbing moiety, i.e., be a photothermal conversion material, typically the photothermal conversion material is a separate compound.

The photothermal conversion material may be either a dye or pigment, such as a dye or pigment of the squarylium, merocyanine, indolizine, pyrylium, or metal diothiolene class. Examples of absorbing pigments are Projet 900, Projet 860 and Projet 830 (all available from the Zeneca Corporation), and carbon black. Dyes, especially dyes with a high extinction coefficient in the range of 750 nm to 1200 nm, are preferred. Absorbing dyes are disclosed in numerous publications, for example, Nagasaka, EP 0,823,327; Van Damme, EP 0,908,397; DeBoer, U.S. Pat. No. 4,973,572; Jandrue, U.S. Pat. No. 5,244,771; and Chapman, U.S. Pat. No. 5,401,618. Examples of useful absorbing dyes include, ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectraIR 830A and SpectraIR 840A (Spectra Colors), and IR Dye A and IR Dye B, whose structures are shown below.

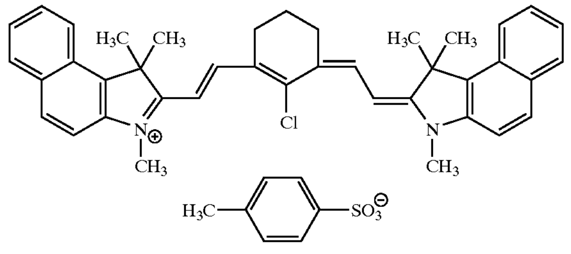

IR Dye A

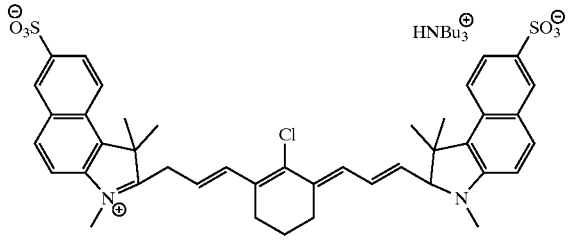

IR Dye B

The amount of photothermal conversion material in the element is generally sufficient to provide an optical density of at least 0.05, and preferably, an optical density of from about 0.5 to about 2 at the imaging wavelength. The amount of an absorber required to produce a particular optical density can be determined from the thickness of the layer and the extinction coefficient of the absorber at the wavelength used for imaging using Beers law.

Absorber Layer

When present, the absorber layer is between the top layer and the underlayer. The absorber layer consists essentially of the photothermal conversion material or a mixture of photothermal conversion materials and, optionally, a surfactant, such as a polyethoxylated dimethylpolysiloxane copolymer, or a mixture of surfactants. In particular, the absorber layer is substantially free of binders, such as the first polymeric material and the second polymeric material. The surfactant may be present to help disperse the photothermal conversion material in a coating solvent.

The thickness of the absorber layer is generally sufficient to absorb at least 90%, preferably at least 99%, of the imaging radiation. The amount of absorber required to absorb a particular amount of radiation can be determined from the thickness of the absorber layer and the extinction coefficient of the absorber at the imaging wavelength using Beers law. Typically the absorber layer has a coating weight of about 0.02 $g/m^2$ to about 2 $g/m^2$, preferably about 0.05 $g/m^2$ to about 1.5 $g/m^2$.

Top Layer

The top layer is ink receptive and protects the underlying layer or layers from the developer. It is insoluble in aqueous alkaline developer prior to imaging. However, exposed (i.e., imaged) regions of the top layer are removable by an aqueous alkaline developer after thermal exposure (i.e., thermal imaging). Though not being bound by any theory or explanation, it is believed that thermal exposure causes the top layer to more readily dissolve or disperse in the aqueous developer and/or weakens the bond between the top layer and the absorber layer. This allows the developer to penetrate the top layer, the absorber layer, and, if present, the underlayer, and remove the absorber layer and dissolve the underlayer, if present, in the exposed regions, revealing the underlying hydrophilic surface of the hydrophilic substrate.

The top layer comprises a second polymeric material, which is a crosslinked polymeric material. The top layer is formed by applying a coating solution comprising a coating solvent and a crosslinkable material over the underlayer or, if present, the absorber layer, and then crosslinking the crosslinkable material to form the second polymeric material. The crosslinkable material may be a single material that crosslinks with itself to form the second polymeric material, or it may comprise a mixture of materials that crosslink with each other to form the second polymeric material, or a combination thereof.

Self-crosslinking polymeric materials may be used in the top layer. Self-crosslinking polymeric materials are polymeric materials that crosslink with themselves. Self-crosslinking may be accomplished, or accelerated, by heating. These materials are typically supplied as aqueous emulsions. Self-crosslinking acrylic emulsions include for example, NEOCRYL® XK-12, a modified acrylic emulsion, and NEOCRYL® XK-98, an acrylic emulsion (NeoResins, Wilmington, Mass., USA). Self-crosslinking urethane/acrylic emulsions include for example, NeoPac E-125, a waterborne aliphatic self-crosslinking urethane/acrylic copolymer (NeoResins).

Melamine containing materials may also be used. The melamine may crosslink to itself, and/or it may crosslink another material such as, for example, a polyurethane dispersion. Polyurethane dispersions include, for example, the WITCOBOND® dispersions (W-160, W-213, W-234, W-336, W-240, W-293, W-296, etc) (Witco, Greenwich, Conn., USA).

Materials that contain epoxide and/or arizidine functionality may be used as crosslinkers. To effect crosslinking, the compound used should comprises at least two epoxide and/or arizidine groups. Typically these materials are mixed with another material, such as a carboxylic acid containing polymer, just prior to application of the material to the underlayer or, if present, the absorber layer, in the manufacture of the imageable element. Crosslinking of the polymer may take place at room temperature, or the material may be heated to enhance crosslinking. An example of this type of system is NEOCRYL® CX-100, a multifunctional ambient temperature cure arizidine crosslinker.

An additional ingredient that generates acid on heating or when irradiated with ultraviolet radiation and/or visible radiation may be added. Heating and/or irradiation of the top layer produces an acid, which catalyzes crosslinking. Numerous such materials are known to those skilled in the art. They include, for example, onium salts in which the onium cation is iodonium, sulphonium, diazonium, phosphonium, oxysulphoxonium, oxysulphonium, sulphoxonium, selenonium, arsonium, or ammonium, and the anion is a non-nucleophilic anion selected from tetrafluoroborate, hexafluorophosphate, hexafluoroantimonate, triflate, tetrakis(pentafluoro-phenyl) borate, pentafluoroethyl sulfonate, p-methyl-benzyl sulfonate, ethyl sulfonate, trifluoromethyl acetate, and pentafluoroethyl acetate; and haloalkyl-substituted s-triazines, which are described, for example, in Smith, U.S. Pat. No. 3,779,778.

The top layer may contain (1) a resole resin, (2) a novolac resin, and (3) either an acid or a compound that generates an acid in the presence of heat and/or light. As disclosed in Haley, U.S. Pat. No. 5,663,037, a mixture of resole resin and a novolac resin crosslinks in the presence of an acid. Resole resins and novolac resins are well known and readily commercially available. These resins are phenolic resins produced by reaction of phenolic compounds with aldehydes under different reaction condition. Differences between resole resins and novolac resins and the processes used in their preparation are described in U.S. Pat. No. 4,708,925 and in British Patent No. 2,082,339. After the top layer is applied, it is exposed with ultraviolet and/or visible radiation, if necessary, to generate the acid catalyst, and then heated to form the crosslinked polymeric material.

The top layer may comprise a photothermal conversion material. However, to minimize ablation of the top layer during thermal imaging, the top layer preferably should not absorb any substantial amount of the imaging radiation, i.e., should be substantially free of photothermal conversion material.

Other Layers

To minimize migration of the photothermal conversion material from the underlayer to the top layer during manufacture and storage of the imageable element, the element may also comprise a barrier layer between the underlayer and the top layer. The barrier layer comprises a third polymeric material that is soluble in aqueous alkaline developer. If the third polymeric material is different from the second polymeric material, it is preferably soluble in at least one organic solvent in which the second organic polymeric material is insoluble. The third polymeric material may be selected from the polymeric materials described as the second polymeric material. In addition to these, a preferred third polymeric material is polyvinyl alcohol.

When the barrier layer and the underlayer comprise the same polymeric material, the barrier layer should be least half the thickness of the underlayer and more preferably as thick as the underlayer. When the third polymeric material, such as polyvinyl alcohol, that is different from the second polymeric material is used, the barrier layer should be less that about one-fifth as thick as the underlayer, preferably less than a tenth of the thickness of the underlayer.

Preparation of the Imageable Element

The thermally imageable element may be prepared by sequentially applying the underlayer over the hydrophilic surface of the substrate; applying the absorber layer, if present, over the underlayer; and then applying the top layer over the underlayer or absorber layer using conventional techniques.

The terms "solvent" and "coating solvent" include mixtures of solvents. They are used even though some or all of the materials may be suspended or dispersed in the solvent rather than in solution. Selection of the solvents used to coat the underlayer, the absorber layer, and the top layer depends on the nature of the photothermal conversion material, the first polymeric material, and the second polymeric material, as well as the other ingredients present in these layers, if any.

The underlayer may be applied over the hydrophilic surface by any conventional method, such as coating or lamination. Typically the ingredients are dispersed or dissolved in a suitable coating solvent, and the resulting mixture coated by conventional methods, such as spin coating, bar coating, gravure coating, or roller coating.

If present, the absorber layer may be applied over the underlayer, typically to the surface of the underlayer, by any conventional method, such as those listed above. To prevent the underlayer from dissolving and mixing with the absorber layer when the absorber layer is coated over the underlayer, the absorber layer is preferably coated from a solvent in which the first polymeric material is essentially insoluble. Thus, if the photothermal conversion material is a dye, the coating solvent for the absorber layer should be a solvent in which the photothermal conversion material is sufficiently soluble that the absorber layer can be formed and in which the first polymeric material and the other components of the underlayer, if any, are essentially insoluble. If the photothermal conversion material is a pigment, a dispersion of the pigment in a solvent such as water in which the first polymeric material and the other components of the underlayer, if any, are essentially insoluble may be coated over the underlayer to form the absorber layer. If the photothermal conversion material is a sublimable dye, the absorber layer may be deposited by sublimation of the photothermal conversion material onto the underlayer.

The top layer is applied over the underlayer or, if present, over the absorber layer. To prevent these layers from dissolving and mixing with the top layer when the top layer is coated, the top layer should be coated from a solvent in which these layers are essentially insoluble. Thus, the coating solvent for the top layer should be a solvent in which the polymeric material in the top layer is sufficiently soluble that the top layer can be formed and in which the materials in the other layers are essentially insoluble. Typically the materials in these layers are soluble in more polar solvents and insoluble in less polar solvents so that the solvent or solvents used to coat these layers is more polar than the solvent used to coat the top layer. Consequently, the top layer can typically be coated from a conventional organic solvent such as toluene or 2-butanone. An intermediate drying step, i.e., drying the underlayer or, if present, the absorber layer, to remove coating solvent before coating the top layer over it, may also be used to prevent mixing of the layers. Alternatively, the underlayer, the top layer or both layers may be applied by conventional extrusion coating methods from a melt mixture of layer components. Typically, such a melt mixture contains no volatile organic solvents.

In one aspect of the invention, the top layer is applied as an aqueous solution or dispersion. This reduces the amount of organic solvent required to manufacture the element and reduces the expense and hazard of working and disposing of organic solvents during the manufacturing process. Applying the top layer as an aqueous dispersion prevents also mixing of layers during the manufacturing process and, thus, minimizes migration of the photothermal conversion material into the top layer during manufacture. Following application of the top layer from an aqueous solvent, the element is typically dried to remove the aqueous solvent.

After top layer has been applied, the crosslinkable material is crosslinked to form the second polymeric material. If the crosslinkable material is thermally crosslinkable, the element is heated to crosslink the crosslinkable material. The drying and crosslinking steps may be separate steps, or they may be combined in a single step. If the drying step is a separate step, it is typically carried out at a lower temperature than the crosslinking step, for example, at 90° C. for 120 sec.

Heating should by carried out for a time and at a temperature sufficient to crosslink the crosslinkable material and make the top layer resistant to developer and to fountain solution. Although the time and temperature required will depend on the nature of the crosslinkable material, heating may be carried out at, for example, 150° C. for 10 min or 160° C. for 1 min. If the top layer comprises a material that generates an acid catalyst when irradiated, the element is blanket irradiated with ultraviolet and/or visible radiation to generate the catalyst. Then the element is typically heated to crosslink the crosslinkable material.

Imaging and Processing

Imaging of the thermally imageable element may be carried out by well-known methods. The element may be imaged with a laser or an array of lasers emitting modulated near infrared or infrared radiation in a wavelength region that is absorbed by the absorber layer. Infrared radiation, especially infrared radiation in the range of about 800 nm to about 1200 nm, is typically used for imaging thermally imageable elements. Imaging is conveniently carried out with a laser emitting at about 830 nm or at about 1056 nm. Suitable commercially available imaging devices include image setters such as the Creo Trendsetter (CREO) and the Gerber Crescent 42T (Gerber).

Alternatively, the thermally imageable element may be imaged using a conventional apparatus containing a thermal printing head. An imaging apparatus suitable for use in conjunction with thermally imageable elements includes at least one thermal head but would usually include a thermal head array, such as a TDK Model No. LV5416 used in thermal fax machines and sublimation printers or the GS618-400 thermal plotter (Oyo Instruments, Houston, Tex., USA).

Imaging produces an imaged element, which comprises a latent image of imaged (exposed) regions and unimaged (unexposed) regions. Development of the imaged element to form a printing plate, or printing form, converts the latent image to an image by removing the imaged (exposed) regions, revealing the hydrophilic surface of the underlying substrate.

The developer may be any liquid or solution that can penetrate and remove the exposed regions of the top layer, the underlying regions of, if present, the absorber layer, and the underlying regions of the underlayer without substantially affecting the complimentary unexposed regions. Development is carried out for a long enough time to remove the exposed regions of the top layer, the underlying regions of, if present, the absorber layer, and the underlying regions of the underlayer in the developer, but not long enough to remove the unexposed regions of the top layer. Hence, the exposed regions are described as being “soluble” or “removable” in the developer because they are removed, and dissolved and/or dispersed, more rapidly in the developer than the unexposed regions. Typically, the underlayer is dissolved in the developer, the absorber layer is either dissolved or dispersed in the developer, and the top layer is dispersed in the developer. Surprisingly, the crosslinked top layer does not affect the developability of the exposed element.

Useful developers are aqueous solutions having a pH of about 7 or above. Preferred aqueous alkaline developers are those that have a pH between about 8 and about 13.5, typically at least about 11, preferably at least about 12. Useful developers include commercially available developers, such as PC3000, PC955, and PC9000, aqueous alkaline developers each available from Kodak Polychrome Graphics LLC.

Development is typically carried out in a processor equipped with an immersion-type developing bath, a section for rinsing with water, a gumming section, a drying section, and a conductivity-measuring unit. Typically, the developer is applied to the imaged precursor by rubbing or wiping the element with an applicator containing the developer. Alternatively, the imaged precursor may be brushed with the developer or the developer may be applied to the precursor by spraying the element with sufficient force to remove the exposed regions. In either instance, a printing plate is produced. Development may be carried out in a commercially available processor, such as a Mercury Processor (Kodak Polychrome Graphics).

Following development, the printing plate is rinsed with water and dried. Drying may be conveniently carried out by infrared radiators or with hot air. After drying, the printing plate may be treated with a gumming solution. A gumming solution comprises one or more water-soluble polymers, for example polyvinylalcohol, polymethacrylic acid, polymethacrylamide, polyhydroxyethylmethacrylate, polyvinyl-methylether, gelatin, and polysaccharide such as dextran, pullulan, cellulose, gum arabic, and alginic acid. A preferred material is gum arabic.

A developed and gummed plate may also be baked to increase the run length of the plate. Baking can be carried out, for example at about 220° C. to about 240° C. for about 7 to 10 minutes, or at a temperature of 120° C. for 30 min.

Industrial Applicability

Once the imageable element has been imaged and processed to form a printing plate, printing can be carried out by applying a fountain solution and then a lithographic ink to the image on its surface. Fountain solution is taken up by the exposed regions, i.e., the surface of the substrate exposed by imaging and development, and the ink is taken up by the unexposed regions. The ink is transferred to a suitable receiving material (such as cloth, paper, metal, glass or plastic) either directly or indirectly through the use of an offset printing blanket to provide a desired impression of the image thereon. The imaging members can be cleaned between impressions, if desired, using conventional cleaning means.

The advantageous properties of this invention can be observed by reference to the following examples, which illustrate but do not limit the invention.

EXAMPLES

| Glossary | |
|---|---|
| Basic Violet 3 | (Ultra Colours and Chemicals of Cheadle Holme, Cheshire, UK) |
| BYK 307 | Polyethoxylated dimethylpolysiloxane copolymer (Byk-Chemie, Wallingford, CT, USA) |
| Copolymer A | Copolymer of N-phenylmaleimide, methacrylamide, and methacrylic acid (45:35:20 mol %) |
| Cymel-303 | Hexamethoxymethylmelamine (American Cyanamid, Toronto, Ontario, Canada) |
| Diazo MSPF6 | 2-Methoxy-4-aminophenyl diazonium hexafluorophosphate (Diversitec, Ft. Collins, CO, USA) |
| DOWANOL ® PM | Propylene glycol methyl ether |
| FC 430 | Fluorinated surfactant (3M, St. Paul, MN, USA) |
| Ethyl Violet | C.I. 42600; CAS 2390-59-2 ($\lambda_{max}$ = 596 nm) $[(p\text{-}(CH_3CH_2)_2NC_6H_4)_3CO^+ Cl^-]$ |
| GP649D99 | Resole resin (Georgia Pacific, Decatur, GA, USA) |
| IR Dye A | Infrared absorbing dye ($\lambda_{max}$ = 830 nm) (Eastman Kodak, Rochester, NY, USA) |
| N13 Resin | m-Cresol novolac resin (Eastman Kodak, Rochester, NY, USA) |
| Nacure 2530 | Amine blocked p-toluene sulfonic acid (King Industries Speciality Chemicals, Norwalk, CT, USA) |

-continued

| Glossary | |
|---|---|
| NEOCRYL ® XK-98 | Self crosslinking acrylic polymer emulsion, about 44% by weight total solids (NeoResins, Wilmington, MA, USA) |
| NeoPac E-125 | Aliphatic self-crosslinking urethane/acrylic copolymer, about 35% by weight total solids (NeoResins, Wilmington, MA, USA) |
| P-3000 | Naphthoquinone diazide of a pyrogallol/acetone resin (PCAS, France) |
| TRITON ® X-100 | Octoxynol-9, ethoxylated alkyl phenol (Rohm & Haas, Philadelphia, PA, USA) |
| WITCOBOND ® W-240 | Polyurethane dispersion, about 30% solids (Crompton Corp., Chicago, IL, USA) |
| ZONYL ® FSN | Fluorosurfactant (DuPont, Wilmington, DE, USA) |

Example 1

This example illustrates preparation and evaluation of a multi-layer imageable element in which the top layer was coated from water. The imageable element was prepared and imaged as follows.

Underlayer Ethyl violet (0.34 g) and BYK 307 (0.21 g of a 10% solution in propylene glycol methyl ether) were added to a solution of Copolymer A (10.81 g) in methyl lactate (94.32 g), diethyl ketone (75.46 g), and water (18.86 g). The mixture was stirred until all the ingredients were in solution and coated onto a 0.3 gauge, aluminum sheet that has been electrograined, anodized and treated with a solution of polyvinylphosphonic acid using a wire wound bar. The resulting element was dried at 90° C. for 120 sec. The coating weight was 1.732 g/m$^2$.

Absorber Layer Carbon black (12.5 g of a 39.6 wt % dispersion in toluene) and BYK-307 (0.002 g) were dispersed in toluene (87.49 g). The resulting dispersion was spin coated over the underlayer and dried at 90° C. for 120 sec. The coating weight was 0.23 g/m$^2$.

Top Laver WITCOBOND® W-240 (2.714 g) was dissolved in water (91.05 g) and 2-butoxyethanol (2.87 g). Cymel-303 (0.482 g), Nacure 2560 (0.676 g), and TRITON® X-100 (0.28 g of a 10 wt % solution in water) were added and the mixture stirred until all the ingredients were in solution. The resulting coating solution was spin coated on the absorber layer and dried at 90° C. for 120 sec. The coating weight was 0.2 g/m$^2$. The resulting imageable element was heated at 150° C. for 10 min.

Imaging The imageable element was imaged with 830 nm radiation using the internal test pattern on a Creo 3230 Trendsetter (Creo Products, Burnaby, BC, Canada) with an imaging energy density of 120 mJ/cm$^2$ (9W). The exposed element was hand developed (25° C., 30 sec) with 953 Developer (solvent based developer, Kodak Polychrome Graphics, Norwalk, Conn., USA) and rinsed under running water for several sec. The resolution appeared to be at least 2–98% at 150 lines per inch.

Example 2 and Comparative Example 1

This example illustrates preparation and evaluation of multi-layer imageable elements in which the top layer was coated from water. The imageable elements were prepared and imaged as follows.

Underlayer A coating solution containing 85 wt % copolymer A and 15 wt % IR Dye A (5.4 wt % total solids) was coated onto the substrate of Example 1 and dried at 90° C. for 120 sec. The coating solvent was methyl lactate/diethyl ketone/water (50:40:10 by weight). The coating weight was 2.0 g/m$^2$.

Top Layer The top layer coating solution of Example 1 was coated on the underlayer using a wire would bar and dried at 90° C. for 120 sec. The coating weight was 0.2 g/m$^2$.

For Example 2, the resulting imageable element was heated at 150° C. for 10 min. For Comparative Example 1, the imageable element was not heated.

Imaging Each imageable element was imaged with an energy density of 115 mJ/cm$^2$ as described in Example 1. The exposed elements were hand developed as described in Example 1. For Example 2, an accurate copy of the test pattern was produced. The resolution appeared to be at least 2–98% at 150 lines per inch. For Comparative Example 1, the entire top layer and underlayer were removed by the developer within 15 sec.

Drop Test Each element was evaluated by the drop test. A large drop of 953 Developer was placed on the top layer of each imageable element at room temperature and the time required to dissolve the layer noted. For Example 2, the time was >200 sec. For Comparative Example 1, the time was less than 15 sec.

Example 3

This example illustrates preparation and evaluation of a multi-layer imageable element in which the top layer was coated from water. The imageable element was prepared and imaged as follows.

Underlayer The underlayer was prepared as described in Example 2.

Top Layer NEOCRYL® XK-98 (4.45 g) and ZONYL® FSN (0.1 g) were dissolved in a mixture of water (90.67 g) and methanol (4.77 g). The resulting coating solution was whirl coated over the underlayer, and the resulting element dried at 90° C. for 120 sec. The coating weight was 0.5 g/m$^2$. The element was heated for 10 min at 100° C.

Imaging The imageable element was imaged with an imaging energy density of 177 mJ/cm$^2$ as described in Example 1. The exposed element was hand developed (25° C., 30 sec, water rinse) with 3000 Developer (positive plate developer, Kodak Polychrome Graphics, Norwalk, Conn., USA). The exposed regions were removed by the developer.

Evaluation The dot values from the test pattern were determined using a Gretag D19C densitometer (Gretag Macbeth Color Data Systems, The Wirral, UK) and compared with the expected dot values. The values are shown in Table 1.

TABLE 1

| Expected Dot Value | Measured Dot Value |
|---|---|
| 10 | 9 |
| 20 | 19 |
| 25 | 26 |
| 30 | 31 |
| 40 | 41 |
| 50 | 50 |
| 60 | 59 |
| 70 | 69 |
| 75 | 75 |
| 80 | 80 |
| 90 | 91 |

Example 4

This example illustrates preparation and evaluation of a multi-layer imageable element in which the top layer was coated from water. The imageable element was prepared and imaged as follows.

Underlayer The underlayer was prepared as described in Example 2.

Top Layer NeoPac E-125 (5.6 g) and ZONYL® FSN (0.1 g) were dissolved in a mixture of water (89.59 g) and methanol (4.72 g). The resulting coating solution was whirl coated over the underlayer, and the resulting element dried at 90° C. for 120 sec. The coating weight was 0.5 g/m$^2$. The element was heated for 10 min at 100° C.

Imaging The imageable element was imaged as described in Example 1 with an imaging energy density of 188J/cm$^2$ as described in Example 1. The exposed element was hand developed (25° C., 30 sec, water rinse) with 3000 Developer. The exposed regions were removed by the developer.

Evaluation The dot values from the test pattern were determined as described in Example 3 and compared with the expected dot values. The values are given in Table 2.

TABLE 2

| Expected Dot Value | Measured Dot Value |
|---|---|
| 10 | 8 |
| 20 | 19 |
| 25 | 24 |
| 30 | 28 |
| 40 | 39 |
| 50 | 49 |
| 60 | 59 |
| 70 | 69 |
| 75 | 76 |
| 80 | 81 |
| 90 | 91 |

Comparative Example 2

This example illustrates preparation and evaluation of a multi-layer imageable element in which the top layer was coated from an organic solvent. The imageable element was prepared and imaged as follows.

Underlayer A mixture containing Copolymer A (84.5 wt %), IR dye A (15.0 wt %), and BYK 307 (0.5 wt %) was prepared as an 8% wt % coating solution in methyl lactate/diethyl ketone/water (50:40:10). The coating solution was coated onto the substrate of Example 1 with a 0.009 inch wire wound bar. The resulting element was dried at 100° C. for 60 sec in a Mathis Labdrier (Werner Mathis AG, Zurich, Switzerland) with a fan speed of 1,000 rpm. The coating weight of the underlayer was 2.0 g/m$^2$.

Top Laver A mixture of P-3000 (96.5 wt %), Basic Violet 3 (3.0 wt %), BYK 307 (0.25 wt %), and FC 430 (0.25 wt %) was prepared as an 8% wt % coating solution in DOWANOL® PM/diethyl ketone (87:13). The coating solution was coated onto the underlayer with a 0.003 inch wire wound bar. The resulting element was dried at 100° C. for 60 sec in a Mathis Labdrier (Werner Mathis AG, Zurich, Switzerland) with a fan speed of 1,000 rpm to produce an imageable element. The coating weight of the top layer was 0.47 g/m$^2$.

Drop Test The imageable element was evaluated by the drop test as described in Example 2, except that 956 Developer (solvent based developer, Kodak Polychrome Graphics, Norwalk, Conn., USA) (Developer 1) and Goldstar™ Developer (sodium metasilicate developer, Kodak Polychrome Graphics, Norwalk, Conn., USA) (Developer 2), were used. The results are shown in Table 3.

Imaging Energy The imageable element was imaged with 830 nm radiation using the internal test pattern plot 0 on a Creo 3230 Trendsetter at 8 Watts and drum speeds of 194, 169, and 149 rpm, corresponding to imaging energy densities of 100, 115, an 130 mJ/cm$^2$, respectively. The exposed elements were hand developed (room temperature, 45 sec) by swabbing while immersed in 956 Developer. The results are shown in Table 3.

The developed elements were inspected under magnification to determine exposure energy. The ideal exposure energy produced easy development, clean background, and a true 50% dot. The results are shown in Table 3.

Ink Receptivity The imaged element was tested for ink receptivity by swabbing with a black plate ink using a wet cloth. The results are shown in Table 3.

Example 5

This example illustrates preparation and evaluation of a multi-layer imageable element in which the top layer was coated from an organic solvent. The imageable element was prepared and imaged as follows.

The procedure of Comparative Example 2 was followed except that the coating solution for the top layer was an 8 wt % solution of N13 resin (58.5 wt %), p-toluene sulfonic acid (1.0 wt %), GP649D99 resole resin (37.0 wt %), Basic Violet 3 (3.0 wt %), BYK 307 (0.25 wt %), and FC 430 (0.25 wt %) in diethyl ketone/DOWANOL® PM/acetone (82:9:9).

The element was dried at 100° C. for 60 sec to produce a top layer with a coating weight was 0.47 g/m$^2$. Then the element was heated at 160° C. for 60 sec in the Mathis Labdrier with a fan speed of 1,000 rpm to produce the imageable element.

The imageable element was evaluated as in Comparative Example 2. The results are shown in Table 3.

Example 6

This example illustrates preparation and evaluation of a multi-layer imageable element in which the top layer was coated from an organic solvent.

The procedure of Comparative Example 2 was followed except that the coating solution for the top layer was an 8 wt % solution of N13 resin (53 wt %), Diazo MSPF6 (10 wt %), GP649D99 resole resin (33.5 wt %), Basic Violet 3 (3.0 wt %), BYK 307 (0.25 wt %), and FC 430 (0.25 wt %) in diethyl ketone/DOWANOL® PM/acetone (75:9:16). The element was dried at 100° C. for 60 sec to produce a top layer with a coating weight was 0.47 g/m$^2$. Then the element was blanket exposed to ultraviolet radiation in a light frame with a Olix A1 131 light integrator (OLEC, Irvine, Calif., USA) for 150 sec and heated at 160° C. for 60 sec in the Mathis Labdrier with a fan speed of 1,000 rpm to produce the imageable element.

The imageable element was evaluated as in Comparative Example 2. The results are shown in Table 3.

Example 7

This example illustrates preparation and evaluation of a multi-layer imageable element in which the top layer was coated from an organic solvent. The procedure of Comparative Example 2 was followed except that the coating solution for the top layer was a 10 wt % solution of N13 resin (60.5 wt %), p-toluene sulfonic acid (1.0 wt %), GP649D99 resole resin (38.0 wt %), BYK 307 (0.25 wt %), and FC 430 (0.25 wt %) in diethyl ketone/DOWANOL® PM/acetone (73:14:13). The coating weight of the top layer was 0.60 g/m$^2$.

The imageable element was evaluated as in Comparative Example 2 except that it was imaged at 8 Watts and drum speeds of 194, 169, and 129 rpm, corresponding to imaging energy densities of 100, 115, and 150 mJ/cm$^2$, respectively. The exposed element was hand developed (room temperature, 60 sec) by swabbing while immersed in 956 Developer. The results are shown in Table 3.

Example 8

This example illustrates preparation and evaluation of a multi-layer imageable element in which the top layer was coated from an organic solvent. The procedure of Comparative Example 2 was followed except that the coating solution for the top layer was a 10 wt % solution of N13 resin (88.5 wt %), p-toluene sulfonic acid (1.0 wt %), Cymel-303 (10.0 wt %), BYK 307 (0.25 wt %), and FC 430 (0.25 wt %) in diethyl ketone/acetone (85:15).

The imageable element was evaluated as in Comparative Example 2. The results are shown in Table 3.

TABLE 3

| Example No. | Imaging Energy mJ/cm$^2$ | Ink receptive | Drop Test (sec) Developer 1[a] | Drop Test (sec) Developer 2[b] |
|---|---|---|---|---|
| C2 | 115 | Yes | 400 | 30 |
| 5 | 115 | Yes | >900 | 400 |
| 6 | 115 | Yes | >900 | 180 |
| 7 | 115 | Yes | >900 | 120 |
| 8 | 150 | Yes | >900 | 120 |

[a]956 Developer (solvent based developer)
[b]Goldstar ™ Developer (sodium metasilicate developer)

Example 9

This example describes the preparation of Copolymer A. Methyl glycol (800 mL) was placed in a 1 L round-bottomed flask equipped with a stirrer, thermometer, nitrogen inlet and reflux condenser. Methacrylic acid (36.12 g), N-phenylmaleimide (165.4 g), and methacrylamide (62.5 g) added and dissolved with stirring. 2,2-Azobisisobutyronitrile (AIBN) (3.4 g) was added and the reaction mixture heated at 60° C. with stirring for 22 hr. Then methanol was added, and the precipitated copolymer filtered, washed twice with methanol, and dried in the oven at 40° C. for 2 days.

If the polymerization is carried out in 1,3-dioxolane, in some cases reprecipitation can be avoided. The monomers are soluble in 1,3-dioxolane, but the polymeric material is insoluble and precipitates during the reaction.

Having described the invention, we now claim the following and their equivalents.

What is claimed is:

1. An imageable element comprising, in order:

a substrate having a hydrophilic surface, an underlayer comprising a first polymeric material over the hydrophilic surface, and a top layer comprising a second polymeric material over the underlayer, in which:

the second polymeric material is crosslinked;

the top layer is ink receptive and insoluble in an alkaline developer;

the top layer and the underlayer are each removable by the alkaline developer following thermal exposure of the element;

the element comprises a photothermal conversion material, and the second polymeric material comprises a crosslinked self-crosslinking material.

2. The element of claim 1 in which the crosslinked self-crosslinking material is a crosslinked self-crosslinking acrylic emulsion or a crosslinked seif-crosslinking urethane/acrylic emulsion.

3. An imageable element comprising, in order:

a substrate having a hydrophilic surface, an underlayer comprising a first polymeric material over the hydrophilic surface, and a top layer comprising a second polymeric material over the underlayer, in which:

the second polymeric material is crosslinked;

the top layer is ink receptive and insoluble in an alkaline developer;

the top layer and the underlayer are each removable by the alkaline developer following thermal exposure of the element;

the element comprises a photothermal conversion material, and the second polymeric material comprises a crosslinked melamine resin.

4. An imageable element comprising, in order:

a substrate having a hydrophilic surface, an underlayer comprising a first polymeric material over the hydrophilic surface, and a top layer comprising a second polymeric material over the underlayer, in which:

the second polymeric material is crosslinked;

the top layer is ink receptive and insoluble in an alkaline developer;

the top layer and the underlayer are each removable by the alkaline developer following thermal exposure of the element;

the element comprises a photothermal conversion material, and the second polymeric material comprises a crossiinked carboxylic acid containing polymer and a crosslinked compound that comprises epoxide or arizidine functionality.

5. An imageable element comprising, in order:

a substrate having a hydrophilic surface, an underlayer comprising a first polymeric material over the hydrophilic surface, and a top layer comprising a second polymeric material over the underlayer, in which:

the second polymeric material is crosslinked;

the top layer is ink receptive and insoluble in an alkaline developer;

the top layer and the underlayer are each removable by the alkaline developer following thermal exposure of the element;

the element comprises a photothermal conversion material, and the second polymeric material comprises a crosslinked naphthoquinone diazide or a crosslinked mixture of a novolac resin and a resole resin.

6. An imageable element comprising, in order:

a substrate having a hydrophilic surface, an underlayer comprising a first polymeric material over the hydrophilic surface, and a top layer comprising a second polymeric material over the underlayer, in which:

the second polymeric material is crosslinked;

the top layer is ink receptive and insoluble in an alkaline developer;

the top layer and the underlayer are each removable by the alkaline developer following thermal exposure of the element;

the element comprises a photothermal conversion material, and the top layer is substantially free of the photothermal conversion material.

7. The element of claim 6 in which the first polymeric material comprises about 25 to about 75 mol% of N-phenylmaleimide; about 10 to about 50 mol% of methacrylamide; and about 5 to about 30 mol % of methacrylic acid.

8. The element of claim 6 in which the second polymeric material comprises a crosslinked melamine resin.

9. The element of claim 6 in which the second polymeric material comprises a crosslinked carboxylic acid containing polymer and a crosslinked compound that comprises epoxide or arizidine functionality.

10. The element of claim 6 in which the second polymeric material comprises a crosslinked naphthoquinone diazide or a crosslinked mixture of a novolac resin and a resole resin.

11. The element of claim 6 additionally comprising an absorber layer between the underlayer and the top layer, in which the absorber layer comprises the photothermal conversion material.

12. The element of claim 6 in which the underlayer comprises the photothermal conversion material.

13. The element of claim 6 in which the second polymeric material comprises a crosslinked self-crosslinking material.

14. The element of claim 13 in which the crosslinked self-crosslinking material is a crosslinked self-crosslinking acrylic emulsion or a crosslinked self-crosslinking urethane/acrylic emulsion.

15. A method for forming an imageable element, the imageable element comprising, in order:

a substrate having a hydrophilic surface, an underlayer comprising a first polymeric material over the hydrophilic surface, and a top layer comprising a second polymeric material over the underlayer, in which:

the second polymeric material is crosslinked;

the top layer is ink receptive and insoluble in an alkaline developer;

the top layer and the underlayer are each removable by the alkaline developer following thermal exposure of the element; and the element comprises a photothermal conversion material;

the method comprising the steps of;

(a) forming the underlayer over the hydrophilic surface of the substrate;

(b) applying a coating solution comprising a coating solvent and a crosslinkable material over the underlayer; and (c) crosslinking the crosslinkable material to form the second polymeric material;

in which the crosslinkable material is crosslinked by heating.

16. A method for forming an imageable element, the imageable element comprising, in order:

a substrate having a hydrophilic surface, an underlayer comprising a first polymeric material over the hydrophilic surface, and a top layer comprising a second polymeric material over the underlayer, in which:

the second polymeric material is crosslinked;

the top layer is ink receptive and insoluble in an alkaline developer;

the top layer and the underlayer are each removable by the alkaline developer following thermal exposure of the element; and the element comprises a photothemal conversion material;

the method comprising the steps of:

(a) forming the underlayer over the hydrophilic surface of the substrate;

(b) applying a coating solution comprising a coating solvent and a crosslinkable material over the underlayer; and (c) crosslinking the crosslinkable material to form the second polymeric material;

in which the crosslinkable material is crosslinked by irradiation with ultraviolet radiation.

17. A method for forming an imageable element, the imageable element comprising, in order:

a substrate having a hydrophilic surface, an underlayer comprising a first polymeric material over the hydrophilic surface, and a top layer comprising a second polymeric material over the underlayer, in which:

the second polymeric material is crosslinked;

the top layer is ink receptive and insoluble in an alkaline developer;

the top layer and the underlayer are each removable by the alkaline developer following thermal exposure of the element; and the element comprises a photothermal conversion material;

the method comprising the steps of:

(a) forming the underlayer over the hydrophilic surface of the substrate;

(b) applying a coating solution comprising a coating solvent and a crosslinkable material over the underlayer; and (c) crosslinking the crosslinkable material to form the second polymeric material;

in which the crosslinkable material comprises a self-crosslinking material.

18. A method for forming an imageable element, the imageable element comprising, in order:

a substrate having a hydrophilic surface, an underlayer comprising a first polymeric material over the hydrophilic surface, and a top layer comprising a second polymeric material over the underlayer, in which:

the second polymeric material is crosslinked;

the top layer is ink receptive and insoluble in an alkaline developer;

the top layer and the underlayer are each removable by the alkaline developer following thermal exposure of the element; and the element comprises a photothermal conversion material;

the method comprising the steps of:

(a) forming the underlayer over the hydrophilic surface of the substrate;

(b) applying a coating solution comprising a coating solvent and a crosslinkable material over the underlayer; and (c) crosslinking the crosslinkable material to form the second polymeric material;

in which the coating solvent comprises water.

19. The method of claim 18 in which the crosslinkable material comprises a self-crosslinking acrylic emulsion or a self-crosslinking urethane/acrylic emulsion.

20. The method of claim 18 in which the crosslinkable material comprises a melamine resin.

21. The method of claim 18 in which the crosslinkable material comprises a carboxylic acid containing polymer and a compound that comprises epoxide or arizidine functionality.

22. The method of claim 18 in which the crosslinkable material is crosslinked by heating.

23. A method for forming an imageable element, the imageable element comprising, in order:

a substrate having a hydrophilic surface, an underlayer comprising a first polymeric material over the hydrophilic surface, and a top layer comprising a second polymeric material over the underlayer, in which:

the second polymeric material is crosslinked;

the top layer is ink receptive and insoluble in an alkaline developer;

the top layer and the underlayer are each removable by the alkaline developer following thermal exposure of the element; and the element comprises a photothermal conversion material;

the method comprising the steps of:

(a) forming the underlayer over the hydrophilic surface of the substrate;

(b) applying a coating solution comprising a coating solvent and a crosslinkable material over the underlayer; and (c) crosslinking the crosslinkable material to form the second polymeric material;

in which the coating solvent is an organic solvent or a mixture of organic solvents.

24. The method of claim 23 which the crosslinkable material is crosslinked by heating.

25. The method of claim 23 in which the crosslinkable material is crosslinked by irradiation with ultraviolet radiation.

26. The method of claim 23 in which the crosslinkable material comprises a carboxylic acid containing polymer and a compound that comprises epoxide or arizidine functionality.

27. The method of claim 23 in which the crosslinkable material comprises a naphthoquinone diazide or a mixture of a novolac resin and a resole resin.

28. A method for forming an image the method comprising the steps of:

thermally imaging an imageable element and forming an exposed imageable element comprising exposed and unexposed regions; and developing the exposed imageable element with an alkaline developer and removing the exposed regions;

in which the imageable element comprises, in order:

a substrate having a hydrophilic surface, an underlayer comprising a first polymeric material over the hydrophilic surface, and a top layer comprising a second polymeric material over the underlayer, in which:

the second polymeric material is crosslinked;

the top layer is ink receptive and insoluble in an alkaline developer;

the top layer and the underlayer are each removable by the alkaline developer following thermal exposure of the element;

the element comprises a photothermal conversion material;

the imaging step is carried out with infrared radiation;

the second polymeric material comprises a crosslinked self-crosslinking material, and the crosslinked self-crosslinking material is a crosslinked self-crosslinking acrylic emulsion or a crosslinked self-crosslinking urethane/acrylic emulsion.

29. A method for forming an image, the method comprising the steps of:

thermally imaging an imageable element and forming an exposed imageable element comprising exposed and unexposed regions; and developing the exposed imageable element with an alkaline developer and removing the exposed regions;

in which the imageable element comprises, in order;

a substrate having a hydrophilic surface, an underlayer comprising a first polymeric material over the hydrophilic surface, and a top layer comprising a second polymeric material over the underlayer, in which:

the second polymeric material is crosslinked;

the top layer is ink receptive and insoluble in an alkaline developer;

the top layer and the underlayer are each removable by the alkaline developer following thermal exposure of the element;

the element comprises a photothermal conversion material;

the imaging step is carried out with infrared radiation; and the second polymeric material comprises a crosslinked melamine resin.

30. A method for forming an image, the method comprising the steps of:

thermally imaging an imageable element and forming an exposed imageable element comprising exposed and unexposed regions; and developing the exposed imageable element with an alkaline developer and removing the exposed regions;

in which the imageable element comprises, in order:

a substrate having a hydrophilic surface, an underlayer comprising a first polymeric material over the hydrophilic surface, and a top layer comprising a second polymeric material over the underlayer, in which:

the second polymeric material is crosslinked;

the top layer is ink receptive and insoluble in an alkaline developer;

the tap layer and the underlayer are each removable by the alkaline developer following thermal exposure of the element;

the element comprises a photothemal conversion material;

the imaging step is carried out with infrared radiation; and the second polymeric material comprises a crosslinked carboxylic acid containing polymer and a crosslinked compound that comprises epoxide or arizidine functionality.

31. A method for forming an image, the method comprising the steps of:

thermally imaging an imageable element and forming an exposed imageable element comprising exposed and unexposed regions; and developing the exposed imageable element with an alkaline developer and removing the exposed regions;

in which the imageable element comprises, in order:

a substrate having a hydrophilic surface, an underlayer comprising a first polymeric material over the hydrophilic surface, and a top layer comprising a second polymeric material over the underlayer, in which:

the second polymeric material is crosslinked;

the top layer is ink receptive and insoluble in an alkaline developer;

the top layer and the underlayer are each removable by the alkaline developer following thermal exposure of the element;

the element comprises a photothermal conversion material;

the imaging step is carried out with infrared radiation; and the second polymeric material comprises a crosslinked naphthoquinone diazide or a crosslinked mixture of a novolac resin and a resole resin.

32. A method for forming an image, the method comprising the steps of:

thermally imaging an imageable element and forming an exposed imageable element comprising exposed and unexposed regions; and developing the exposed imageable element with an alkaline developer and removing the exposed regions;

in which the imageable element comprises, in order;

a substrate having a hydrophilic surface, an underlayer comprising a first polymeric material over the hydrophilic surface, and a top layer comprising a second polymeric material over the underlayer, in which:

the second polymeric material is crosslinked;

the top layer is ink receptive and insoluble in an alkaline developer;

the top layer and the underlayer are each removable by the alkaline developer following thermal exposure of the element;

the element comprises a photothermal conversion material;

the imaging step is carried out with infrared radiation; and the top layer is substantially free of the photothermal conversion material.

33. The method of claim 32 in which the second polymeric material comprises a crosslinked self-crosslinking material.

34. The method of claim 33 in which the crosslinked self-crosslinking material is a crosslinked self-crosslinking acrylic emulsion or a crosslinked self-crosslinking urethane/acrylic emulsion.

35. The method of claim 32 in which the second polymeric material comprises a crosslinked melamine resin.

36. The method of claim 32 in which the second polymeric material comprises a crosslinked carboxylic acid containing polymer and a crosslinked compound that comprises epoxide or arizidine functionality.

37. The method of claim 32 which the second polymeric material comprises a crosslinked naphthoquinone diazide or a crosslinked mixture of a novolac resin and a resole resin.

* * * * *

UNITED STATES PATENT AND TRADEMARK OFFICE

CERTIFICATE OF CORRECTION

PATENT NO. : 6,830,862 B2
DATED : December 14, 2004
INVENTOR(S) : Paul Kitson et al.

It is certified that error appears in the above-identified patent and that said Letters Patent is hereby corrected as shown below:

Column 24,
Line 43, delete "claim 32 which" and insert -- claim 32 in which --.

Signed and Sealed this

Twenty-sixth Day of April, 2005

JON W. DUDAS
*Director of the United States Patent and Trademark Office*